United States Patent [19]

Andrews

[11] Patent Number: 5,175,643

[45] Date of Patent: Dec. 29, 1992

[54] MONOLITHIC INTEGRATED MASTER OSCILLATOR POWER AMPLIFIER

[75] Inventor: John R. Andrews, Fairport, N.Y.

[73] Assignee: Xerox Corporation, Stamford, Conn.

[21] Appl. No.: 768,786

[22] Filed: Sep. 30, 1991

[51] Int. Cl.⁵ .................. H01S 3/23; H01L 15/00
[52] U.S. Cl. .................. 359/339; 359/341; 359/344; 372/50
[58] Field of Search .......... 359/337, 339, 341, 344, 359/334; 372/6, 50; 357/17, 30

[56] References Cited

U.S. PATENT DOCUMENTS

| | | | |
|---|---|---|---|
| 3,828,231 | 8/1974 | Yamamoto | 357/30 |
| 4,191,928 | 3/1980 | Emmett | 359/337 |
| 4,551,684 | 11/1985 | Bernhardt | 359/344 |
| 4,716,449 | 12/1987 | Miller | 357/30 |
| 4,744,089 | 5/1988 | Montroll et al. | 372/50 |
| 4,747,650 | 5/1988 | Sakuda | 350/96.14 |
| 4,772,854 | 9/1988 | Silberberg | 359/334 |
| 4,856,017 | 8/1989 | Ungar | 372/96 |
| 4,945,315 | 7/1990 | Shinada | 359/344 |
| 4,977,567 | 12/1990 | Hanke | 372/45 |
| 5,003,550 | 3/1991 | Welch et al. | 372/50 |
| 5,007,698 | 4/1991 | Sasaki et al. | 359/341 |
| 5,019,787 | 5/1991 | Carlson et al. | 330/4.3 |
| 5,047,822 | 9/1991 | Little et al. | 357/30 |
| 5,050,949 | 9/1991 | Di Giovanni et al. | 359/341 |

OTHER PUBLICATIONS

King et al; "Investigation of . . . Saturable Absorbers . . .", Opt. Soc. Am., Feb. 9, 1978 Mtg., pp. ThD14/1-2, 1977; abstract only supplies.

Andrews et al; "High Power and Spatial . . . Amplifier"; Opt. Lett., vol. 16, #12, pp. 913-915, Jun. 15, 1991, abst. only provided.

Andrews, "Interferometric power amplifiers," Optic Letters, vol. 14, No. 1, Jan. 1, 1989—pp. 33-35.

Andrews, "Variable focusing due to refractive-index gradients in a diode-array traveling-wave amplifier," Journal of Applied Physics, vol. 64, No. 4, Aug. 15, 1988—pp. 2134-2137.

Andrews et al., "A model for the nearly single lobed far field in a diode array traveling wave amplifier," SPIE vol. 893 High Power Laser Diodes, Jan. 14-15, 1988, pp. 65-69.

Andrews et al., "Diffraction effects in a diode array traveling wave amplifier," Applied Physics Letters, vol. 51, Nov. 23, 1987, -pp. 1676-1678.

Andrews, "Traveling-wave amplifier made from a laser diode array," Applied Physics Letters, vol. 48, No. 20, May 19, 1986—pp. 1331-1333.

Bendelli et al., "A New Structure for High-Power TW-SLA," IEEE Photonics Technology Letters, vol. 3, No. 1 Published: Jan. 1991, pp. 42-44.

Koren et al., "Wavelength Division Multiplexing Light Source with Integrated Quantum Well Tunable Lasers and Optical Amplifiers", AT&T Bell Laboratories. Accepted for Publication: Mar. 13, 1989.

Ikeda et al., "Transverse Mode Controlled Wide-Single-Stripe Lasers by Loading Modal Filters", SPIE vol. 1043 Laser Diode Technology and Applications (1989), pp. 81-86.

*Primary Examiner*—Nelson Moskowitz
*Attorney, Agent, or Firm*—Gary B. Cohen

[57] ABSTRACT

A monolithic integrated master oscillator power amplifier is provided comprising means for generating and emitting a laser beam and means for amplifying the laser beam. The amplifying means is in communication with the generating and emitting means, and the amplifying means has a region in which the laser beam can expand freely prior to being outputted from the amplifying means. The means for generating and emitting and the amplifying means are coupled to each other by means for selectively controlling the laser beam as the laser beam is communicated from the generating and emitting means to the amplifying means. The means for generating and emitting and the controlling means are in communication with means for supplying pumping current independently to each of the generating and emitting means and the controlling means.

21 Claims, 2 Drawing Sheets

MONOLITHIC INTEGRATED MASTER OSCILLATOR POWER AMPLIFIER

BACKGROUND OF THE INVENTION

1. Field of the Invention

The present invention relates generally to high power semiconductor diode laser configurations, and more particularly to a diode laser oscillator integrated monolithically with an optical power amplifier by way of a controlling or pre-amplifying section.

2. Description of the Prior Art

Semiconductor diode lasers are useful for a wide variety of applications, such as fiberoptic communications and optical data retrieval. Some potential applications, such as optical space communications, optical recording, semiconductor processing, spectrum analysis, laser radar, range finding and contour mapping require high power, single spectral and spatial mode optical sources. Unfortunately, presently available diode laser configurations have difficulty in achieving both high power and a diffraction limited single mode beam in a single device. Diffraction limited single mode lasers are commercially available with an output power of 100 mW cw.

Phased array lasers are capable of achieving higher power. For example, a 10 W cw laser bar is commercially available. However, phased array lasers in general, tend to have poor modal discrimination due to a variety of causes, including gain non-linearities and spatial hole burning. These lasers operate in a diffraction limited single mode at low to moderate output powers, but as multimode oscillators at high power, some even at currents only slightly above threshold. Laser arrays that are most successful at maintaining a diffraction limited output do so only by suppressing other more favored modes, thereby limiting the achievable output.

Monolithic master oscillator power amplifiers (MOPAs) capable of delivering respective power outputs of 1 W without the poor modal discrimination of the phased array laser are disclosed by the following patents:

U.S. Pat. No. 4,744,089. Patentee: Montroll et al. Issued: May 10, 1988.

U.S. Pat. No. 5,003,550. Patentee: Welch et al. Issued: Mar. 26, 1991.

U.S. Pat. No. 4,744,089 discloses a MOPA with a laser diode or oscillator, the laser diode having a periodic grating providing distributed feedback. A power amplifier with a diverging active area follows the laser, and the amplifier output facet is made anti-reflecting. The laser oscillator and amplifier are formed with separate electrical contacts so they can be driven by independent current sources.

U.S. Pat. No. 5,033,550 discloses a MOPA comprising a single mode diode laser with distributed Bragg reflectors, an amplifier in tandem with the laser, lateral phase controllers and a detuned second order grating surface output coupler, all on a common substrate. The lateral phase controllers are an array of separately addressable electrodes that adjust the optical path length to compensate for phase variation in the amplifiers and also to provide lateral steering of the output beam.

While the MOPA disclosed by Montroll et al. is capable of amplifying the laser beam to a desirable power level, it does not disclose suitable means for controlling the laser beam. More particularly, U.S. Pat. No. 4,744,089 only contemplates one way to control the laser beam, i.e. selectively modulating the laser beam at it source by selectively pumping current in the master oscillator. This sort of selective current pumping, however, can lead to "chirpping" in which the wavelength of the laser is shifted undesirably during the modulation process. Even though the MOPA disclosed by Welch et al. is well suited to adjust for inhomogeneities and non-linearities in the amplifier section, it fails to disclose any means for controlling the laser beam exiting the oscillator. Consequently, the degree to which the a laser beam can be controlled by the Welch et al. MOPA is limited severely. It would be desirable to provide a simply designed MOPA, such as the MOPA disclosed by Montroll et al, having a section adapted to effect a broad range of suitable control operations on the laser beam.

References, which may be pertinent to the consideration of various aspects of the present invention, are listed below:

U.S. Pat. No. 4,747,650. Patentee: Sakuda. Issued: May 31, 1988.

U.S. Pat. No. 4,856,017. Patentee: Ungar. Issued: Aug. 8, 1989.

U.S. Pat. No. 4,977,567. Patentee: Hanke. Issued: Dec. 11, 1990.

U.S. Pat. No. 5,019,787. Patentee: Carlson et al. Issued: May 28, 1991.

Bendelli et al. "A New Structure for High-Power TW-SLA". IEEE Photonics Technology Letters, Vol. 3, No. 1. Published: January, 1991. pp. 42–44.

Koren et al. "Wavelength Division Multiplexing Light Source with Integrated Quantum Well Tunable Lasers and Optical Amplifiers". AT&T Bell Laboratories. Accepted for Publication: Mar. 13, 1989.

Ikeda et al. "Transverse Mode Controlled Wide-Single-Stripe Lasers by Loading Modal. Filters". SPIE Vol. 1043 Laser Diode Technology and Applications (1989). pp. 81–86.

A brief summary of the above references follows below:

U.S. Pat. No. 4,747,650 discloses a semiconductor optical amplifier comprising three semiconductor waveguides, each of which is fabricated on the same semiconductor chip. The first waveguide transmits an optical signal, while the third waveguide forms an optical coupling with the first waveguide and operates as an optical amplifier.

U.S. Pat. No. 4,856,017 discloses a semiconductor laser having an elongated active gain medium layer with a wide output facet at one end and a relatively narrower facet at the other end. Means are provided between the facets for providing frequency dependent feedback for the gain layer. The layer is pumped for stimulating emission of radiation, with the pumped area having parallel edges adjacent to the smaller facet and diverging toward the wider output facet.

U.S. Pat. No. 4,977,567 discloses a semiconductor laser arrangement for high output power in a lateral fundamental mode. The arrangement comprises a laser region, including a waveguide, as well as a coupling region, and an intensification region, the laser, coupling and intensification regions being integrated on a common substrate. Contacts are respectively coupled with the substrate, the laser region and the intensification region for pumping current to the arrangement.

U.S. Pat. No. 5,019,787 discloses an optical amplifier comprising a body of semiconductor material having means for receiving a beam of light and directing the beam along a path in the body. A gain section is provided along the beam path though the body, the gain section being capable of amplifying the beam. The body also includes means for receiving the amplified beam from the gain section and directing the amplified beam out of the body.

The article entitled "A New Structure for High-Power TW-SLA" discloses a structure, comprised of an exponentially tapered active layer, for traveling wave semiconductor laser amplifiers (TW-SLA) to improve the saturation output power and the quantum efficiency thereof.

The article entitled "Wavelength Division Multiplexing Light Source with Integrated Quantum Well Tunable Lasers and Optical Amplifiers" discloses a photonic integrated circuit composed of three 1.5 μm wavelength multiple quantum well tunable lasers with a passive optical output power combiner and an optical output amplifier.

The article entitled "Transverse Mode Controlled Wide-Single-Stripe Lasers by Loading Modal Filters" discloses two kinds of modal filters for high power diode lasers with a wide stripe.

SUMMARY OF THE INVENTION

In accordance with the present invention, monolithic integrated master oscillator power amplifier is provided comprising means for generating and emitting a laser beam and means for amplifying the laser beam. The amplifying means is in communication with the generating and emitting means, and the amplifying means has a region in which the laser beam can expand freely prior to being outputted from the amplifying means. The means for generating and emitting and the amplifying means are coupled to each other by means for selectively controlling the laser beam as the laser beam is communicated from the generating and emitting means to the amplifying means. The means for generating and emitting and the controlling means are in communication with means for supplying pumping current independently to each of the generating and emitting means and the controlling means.

In one aspect of the disclosed embodiment of the present invention, the generating and emitting means and the controlling means comprise respective regions, while the monolithic integrated master oscillator power amplifier further comprises means for electrically isolating the respective regions of the generating and emitting means and the controlling means.

In yet another aspect of the disclosed embodiment of the present invention, the controlling means includes either means for modulating the laser beam emitted from the generating and emitting means or means for selectively absorbing light having an intensity below a preselected threshold level. Moreover, the region of the amplifying means can increase in width either linearly or exponentially in the amplifying direction.

Various features of the present invention will be appreciated by those skilled in the art. First, the MOPA provides a wide range of control to the laser beam emitted from the master oscillator. In one example, the laser beam can be modulated, by use of the control section, without being subjected to "chirpping." In another example, stray light emitted by the master oscillator can be absorbed so that optical contrast is maximized. Second, by modifying the taper of the amplifying region, the MOPA can be used interchangeably as a saturated or unsaturated amplifier. Finally, the MOPA is capable of amplifying the laser beam to a relatively high level of power. Due to the simple, yet effective design of the MOPA, the relatively high level of power can be achieved while the power density is maintained below the damage threshold, and the self-oscillation threshold is kept relatively high.

These and other aspects of the invention will become apparent from the following description, the description being used to illustrate a preferred embodiment of the invention when read in conjunction with the accompanying drawings.

DESCRIPTION OF A PREFERRED EMBODIMENT OF THE INVENTION

While the present invention will hereinafter be described in connection with a preferred embodiment thereof, it will be understood that it is not intended to limit the invention to that embodiment. On the contrary, it is intended to cover all alternatives, modifications and equivalents as may be included within the spirit and scope of the invention as defined by the appended claims.

Figure 1:
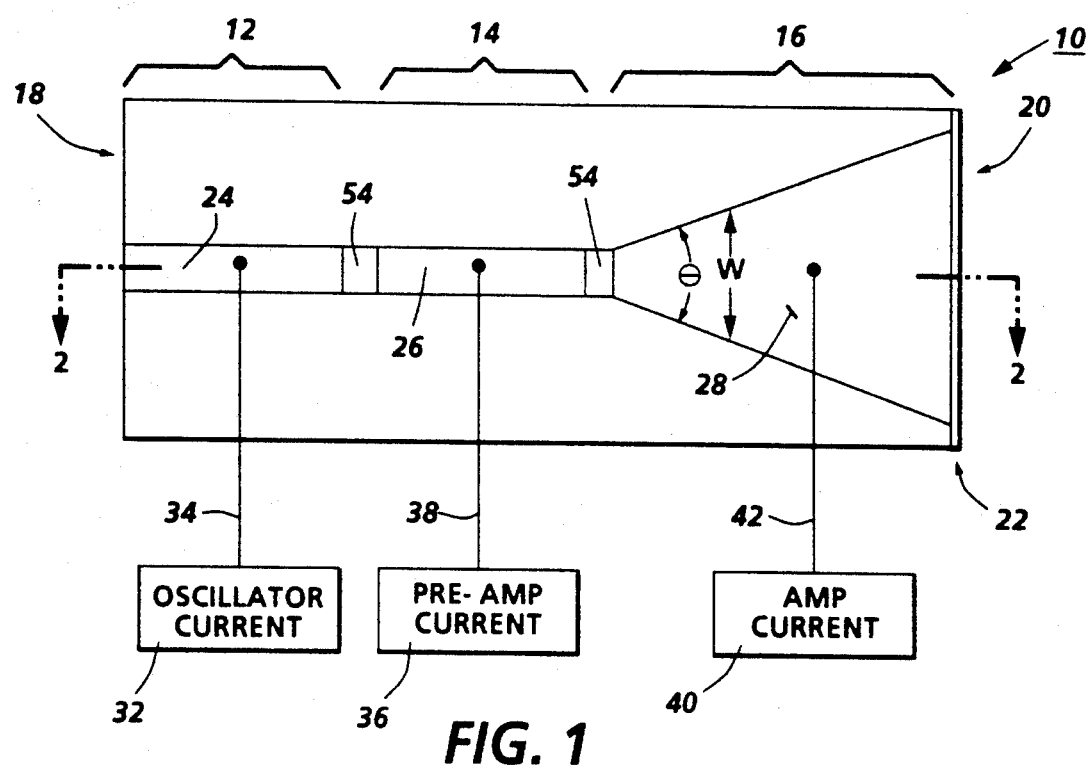
FIG. 1 is a top plan view of a monolithic integrated master oscillator power amplifier (MOPA) embodying a preferred embodiment of the present invention.

Referring to FIG. 1, a preferred embodiment of a master oscillator power amplifier (MOPA) is designated by the numeral 10. The MOPA 10 comprises three sections, namely a master oscillator or laser generating section 12, a pre-amplifier or control section 14 and an amplifier section 16. Facets 18 and 20 are defined along edges of the MOPA 10, and may be made anti-reflecting in a conventional manner, such as by use of an anti-reflecting coating 22 on the facet 20. Current is transmitted to sections 12, 14 and 16 at conductive 24, 26 and 28, respectively. The stripe 24 is coupled with an oscillator current source 32 by way of line 34. The stripe 26, which preferably has the same width as stripe 24, is coupled with a preamplifier current source 36 by way of line 38. The stripe 28, the width of which expands relative to the width of stripes 24 and 26, is coupled with an amplifier current source 40 by way of line 42.

In stripe 24, isolating material 54 and stripe 26, lateral confinement is achieved by a single mode waveguide in which the refractive index is higher outside of the region than within. Additionally, the electrical conductive region and optical waveguide overlap in stripes 24, 26. Lateral confinement can be achieved by way of known structures, such as ridge or strip-loaded guides, or methods, such as impurity induced disordering.

Figure 2:
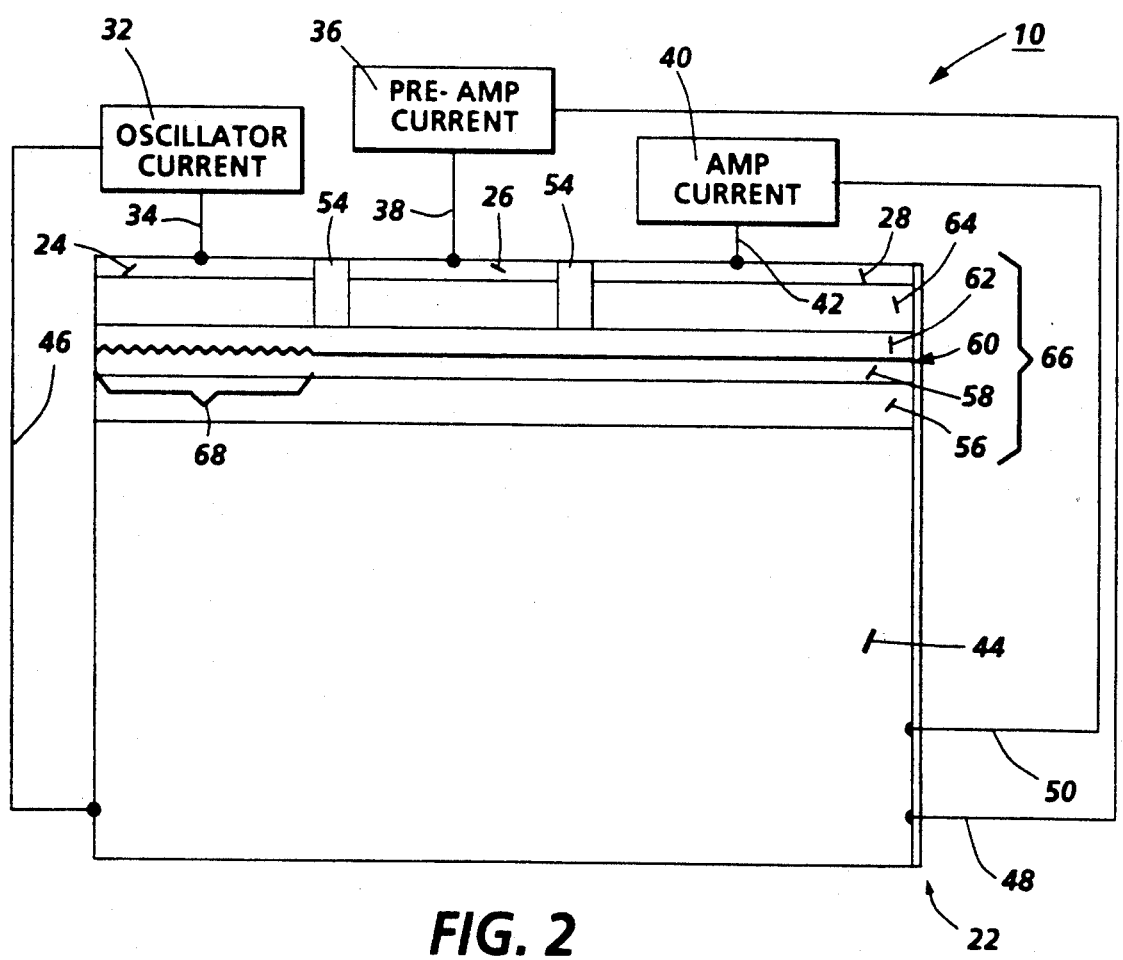
FIG. 2 is a cross-sectional view of the MOPA of FIG. 1 taken along the plane 2—2.

Referring to FIG. 2, the MOPA 10 includes a substrate 44, to which the sources 32, 36 and 40 are coupled by respective lines 46, 48 and 50. Electrical isolating material 54 separates the stripe 24 from the stripe 26 as well as the stripe 26 from the stripe 28. In one example the electrical isolating material 54 is achieved with known proton implants. Alternatively, the electrical isolation could be achieved by etching or using dielectric material, such as SiO₂. Separation between the stripes 24, 26 and 28 allows current to be pumped independently to each of the same so that the stripes 24, 26 and 28 can be biased individually.

Referring still to FIG. 2, the substrate 44, which serves as the base of the MOPA 10, is commonly composed of GaAs, or any other suitable semiconductor compounds from columns 3 and 5 of the Periodic Table. Overlying the substrate 44 is a lower cladding layer 56 doped with n-type dopant and an optical confinement layer 58 doped with n-type dopant. An active layer 60 is disposed between the optical confinement layer 58 and an optical confinement layer 62 doped with p-type dopant.

Overlying the optical confinement layer 62 is an upper cladding layer 64 doped with p-type dopant. An optical waveguide 66 is formed in the layers 56, 58, 60, 62 and 64, in a plane perpendicular to a junction between the optical confinement layers 58, 62. The layers 56, 58, 60, 62 and 64 are typically composed of AlGaAs, and their compositions may be varied by adjusting mole fraction or energy band-gap, as explained in U.S. Pat. No. 4,744,089 (Patentee: Montroll et al.) or U.S. Pat. No. 5,019,787 (Patentee: Carlson et al.), the pertinent portions of which are incorporated herein by reference.

In the illustrated embodiment of FIG. 2, the master oscillator section 12 is implemented with a distributed feedback (DFB) semiconductor laser diode in which a first grating pattern 68 is employed to generate the laser beam. The first grating pattern 68, which has a width at least that of the conductive stripe 24 and a length substantially that of the stripe 24, is disposed along the active layer 60. Further details regarding the structure and operation of the DFB semiconductor laser diode are discussed in U.S. Pat. No. 4,744,089. It will be appreciated by those skilled in the art that various known master oscillator arrangements capable of generating a laser could be used in place of the DFB semiconductor laser diode. In one example, the master oscillator section 12 could be implemented with etched mirrors. In yet another example, the master oscillator section 12 could comprise the kind of distributed Bragg reflector (DBR) semiconductor laser diode shown in U.S. Pat. No. 5,003,550 (Patentee: Welch et al.), the pertinent portions of which are incorporated herein. In yet another example the master oscillator section 12 could be implemented by configuring a quantum well layer as shown in U.S. Pat. No. 5,019,787, the pertinent portions of which are incorporated herein.

The control section 14 possesses a structure that is equivalent to that of the laser section 12. Various functions provided by the control section 14 will be discussed in further detail below.

Figure 3:
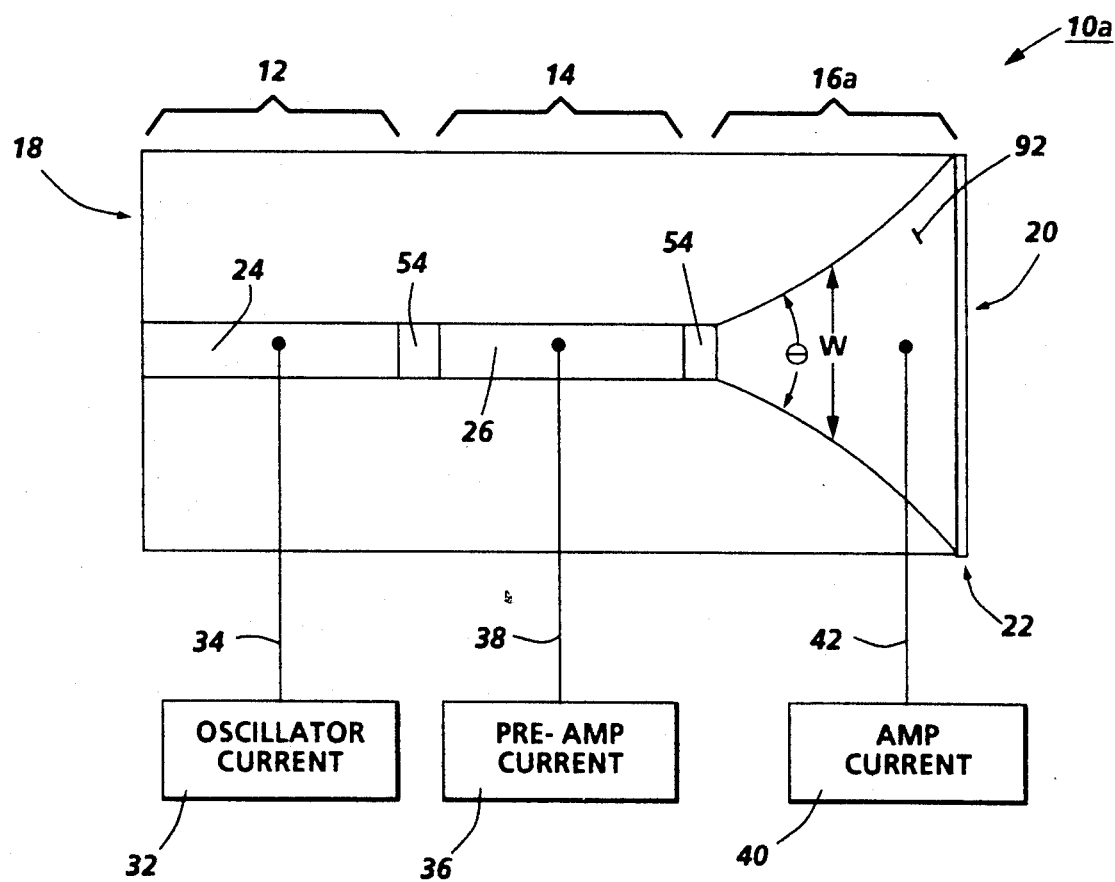
FIG. 3 is a top plan view of another preferred embodiment of the MOPA of the present invention.

In the illustrated embodiment of FIG. 1, the amplifier section 14 comprises a tapered width section, the tapered section having a width W and being defined by an arc $\theta$. In one example, the dimensions of the tapered section are configured to obtain an output similar to that of the MOPA in U.S. Pat. No. 4,744,089 (Patentee: Montroll et al). That is, the width of the tapered section increases linearly from the output of the laser section 12 to the facet 20. Referring to FIG. 3, another embodiment of the MOPA 10 is designated by the numeral 10a. The MOPA 10a is identical in structure to the MOPA 10 except that the MOPA 10a has an amplifier section 16a, the amplifier section 16a including a conductive contact 92. The contact 92 has a width that varies exponentially from the output of the control section 14 to the facet 20. It will be appreciated by those skilled in the art that various shapes could be used in place of those shown for contacts 28, 92 without altering the concept upon which the present invention is based. The significance of width variation in the amplifier sections 16 and 16a will be discussed in further detail below.

In the preferred form of operation, a laser beam is generated in a known manner by use of the master oscillator section 12 so that a clean optical mode is injected to the control section 14. To insure that only light above a given threshold level is transmitted to the amplifier section 16, the control section 14 can be employed as a "saturable nonlinear absorber" by pumping a suitable current thereto with the preamplifier current source 36. Prohibiting light transmission below the given threshold allows for minimizing of background noise. Optical contrast of the MOPA 10 is maximized when background noise is minimized.

The control section 14 can operate on the mode exiting the laser section in at least three other respects. First, the control section 14 can serve as an amplitude or frequency modulator for the exiting mode without subjecting the mode to chirpping. For example, amplitude modulation can be achieved by selectively pumping the control section 14 with current, via the preamplifier current source 36, so that only preselected pulses exit the control section 14. Second, the control section 14 can act as a variable gain device for the laser beam exiting the laser section 12. For example, current of the control section 14 can be used to boost the power of the beam outputted from the master oscillator section 12.

Finally, the control section 14 can be used as a phase controller. By varying refractive index with known phenomena, such as the current-dependent refractive index or the quantum confined Stark effect, the phase of the beam entering the amplifier section 16 can be shifted relative to the phase of the beam exiting the master oscillator section 12. As will be appreciated by those skilled in the art, the ability to shift phase in the waveguide 66 makes the MOPA 10 particularly useful in in communications applications.

The controlled mode exiting the control section 14 is allowed to freely expand in the amplifier section 16 while it is being amplified. Amplification of the controlled mode in the amplifier section 16 accomplishes at least three purposes. First, it allows the power to spread within the gain region of the amplifier section 16 to reach relatively high levels of power prior to exceeding gain saturation. Second, when a relatively large facet 20 is provided, the high levels of power can be obtained while the power density at the facet 20 is maintained below a damage threshold. Finally, since any reflections from the facet 20 are relatively inefficiently coupled back into the sections 12, 14, the self-oscillation threshold for the MOPA 10 is kept relatively high. Moreover, the anti-reflection coating on facet 20 referred to above tends to increase the threshold for self-oscillation even further.

Referring to FIGS. 1 and 3, the width of the tapered amplifier sections 16 and 16a is discussed in further detail. The MOPA 10 (FIG. 1) is particulary suited for use in an amplifier that is commonly referred to as a saturated amplifier, while the MOPA 10a (FIG. 3) is particularly suited for use in an amplifier that is commonly referred to as an unsaturated amplifier. The saturated amplifier permits linear increase of power with distance while the unsaturated amplifier permits exponential increase of power with distance. While either of MOPAs 10, 10a can be used as power amplifiers, the MOPA 10a is particularly well suited for, among other things, analog intensity control.

What is claimed is:

1. A traveling wave monolithic integrated master oscillator power amplifier of the type formed on a substrate of a semiconductor, comprising:

means for generating a laser beam;

means, communicating with said generating means, for amplifying the laser beam, said amplifying means having a region in which the laser beam can expand freely prior to being outputted from said amplifying means;

a control region characterized by an electrical characteristic and disposed intermediate of said generating and said amplifying means, said generating means and said control region being integrated monolithically on the semiconductor substrate; and means, communicating with said control region, for altering the electrical characteristic of said control region to selectively control the laser beam as the laser beam is communicated from said generating means to said amplifying means;

said altering means applying at least one of a plurality of signals to said control region for obtaining at least one of a plurality of functionally different electrooptical effects.

2. The monolithic integrated master oscillator power amplifier of claim 1 in which said generating means includes a generating region, wherein said generating region and said control region comprise respective regions.

3. The monolithic integrated master oscillator power amplifier of claim 2, further comprising means for electrically isolating said generating region and said control region.

4. The monolithic integrated master oscillator power amplifier of claim 2, further comprising means for electrically isolating the region of said amplifying means from said control region.

5. The monolithic integrated master oscillator power amplifier of claim 2, wherein the generating region and said control region are substantially coplanar and of substantially the same width.

6. The monolithic integrated master oscillator power amplifier of claim 5, wherein the generating region and said control region comprise substantially the same material.

7. The monolithic integrated master oscillator power amplifier of claim 1, further comprising current supply means for supplying pumping current to said amplifying means independently of said generating means and said altering means.

8. The monolithic integrated master oscillator power amplifier of claim 1, wherein the functional electro-optical effect comprises modulating the laser beam emitted from said generating means.

9. The monolithic integrated maser oscillator power amplifier of claim 1, wherein the functional electro-optical effect comprises selectively absorbing light having an intensity below a preselected threshold level.

10. The monolithic integrated master oscillator power amplifier of claim 1, wherein the region of said amplifying means increases linearally in width in the amplifying direction.

11. The monolithic integrated master oscillator power amplifier of claim 1, wherein the region of said amplifying means increases exponentially in width in the amplifying direction.

12. The monolithic integrated master oscillator power amplifier of claim 1, wherein said generating means comprises an electrically wavelength tunable distributed feedback laser.

13. A method for amplifying a laser beam with a traveling wave monolithic integrated master oscillator power amplifier, the amplifier having an oscillator section in communication with an amplifying section, the oscillator section being coupled with the amplifying section by a control section, the oscillator section and the control section being integrated monolithically on a common semiconductor substrate, the control section having an electrical characteristic associated therewith, said method comprising the step of:

generating the laser beam in the oscillator section;

emitting the laser beam from the oscillator section so that the laser beam is received by the controlled section;

controlling the laser beam in the control section by altering the electrical characteristic associated therewith, the controlling step including applying at least one of a plurality of signals to the control section for obtaining at least one of a plurality of functionally different electro-optical effects; and transmitting the laser beam from the control section to the amplifying section, the amplifying section having a region in which the beam freely expands prior to being outputted therefrom.

14. The method of claim 13, further comprising the step of supplying pumping current to each of the oscillator section and the control section independently of each other.

15. The method of claim 14, further comprising the step of supplying pumping current to the amplifying section independently of both the oscillator section and the control section.

16. The method of claim 13, wherein the oscillator and control sections have respective regions, and wherein the method further comprises the step electrically isolating the region of the oscillator section from the region of the control section.

17. The method of claim 16, further comprising the step of electrically isolating the region of the control section from the region of the amplifying section.

18. The method of claim 13, wherein the step of controlling the laser beam in the control section comprises applying one of the plurality of signals for modulating the laser beam emitted from the oscillator section.

19. The method of claim 13, wherein the step of controlling the laser beam in the control section comprises applying one of the plurality of signals for selectively absorbing light having an intensity below a preselected threshold level.

20. The traveling wave monolithic integrated master oscillator power amplifier of claim 1, wherein said altering means comprises a current supply for pumping current to said altering means for obtaining the at least one of the plurality of functionally different electro-optical effects.

21. The method of claim 13, wherein said controlling step comprises the step of altering the electrical characteristic by pumping current to the control section for obtaining the at least one of the plurality of functionally different electo-optical effects.

* * * * *